(12) United States Patent
Yuan et al.

(10) Patent No.: US 6,374,833 B1
(45) Date of Patent: Apr. 23, 2002

(54) METHOD OF IN SITU REACTIVE GAS PLASMA TREATMENT

(75) Inventors: Tien-Min Yuan; Shih-Chi Lai; Yen-Chung Feng; Tsung-Hua Wu, all of Hsinchu (TW)

(73) Assignee: Mosel Vitelic, Inc. (TW)

( * ) Notice: Subject to any disclaimer, the term of this patent is extended or adjusted under 35 U.S.C. 154(b) by 0 days.

(21) Appl. No.: 09/305,524

(22) Filed: May 5, 1999

(51) Int. Cl.$^7$ .................................................. C25F 1/00
(52) U.S. Cl. .................. 134/1.1; 134/1.2; 134/22.1; 134/902; 438/905; 438/906
(58) Field of Search .................. 156/643.1; 134/1.1, 134/1.2, 2, 22.1, 22.14, 22.18, 22.19, 30, 34, 902; 438/710, 714, 734, 905, 906; 216/37, 67

(56) References Cited

U.S. PATENT DOCUMENTS

| | | | |
|---|---|---|---|
| 4,786,352 A | * 11/1988 | Benzing | 156/345 |
| 4,816,113 A | 3/1989 | Yamazaki | 156/643 |
| 4,992,137 A | 2/1991 | Cathey, Jr. et al. | 156/643 |
| 5,356,478 A | * 10/1994 | Chen et al. | 134/1 |
| 5,456,796 A | * 10/1995 | Gupta et al. | 156/643.1 |
| 5,647,953 A | * 7/1997 | Williams et al. | 156/643.1 |
| 5,753,137 A | * 5/1998 | Ye et al. | 252/79.1 |
| 5,756,400 A | * 5/1998 | Ye et al. | 438/710 |
| 5,801,101 A | * 9/1998 | Miyoshi | 438/714 |
| 5,968,847 A | * 10/1999 | Ye et al. | 438/734 |
| 6,136,211 A | * 10/2000 | Qian et al. | 216/37 |

FOREIGN PATENT DOCUMENTS

| | | | | |
|---|---|---|---|---|
| EP | 0776032 A2 | * | 5/1997 | H01L/21/311 |
| JP | 04056770 A | * | 6/1990 | C23C/16/44 |
| JP | 04-56770 A | * | 2/1992 | C23C/16/44 |
| JP | 08291299 A | * | 11/1996 | C11D/7/28 |

* cited by examiner

Primary Examiner—Randy Gulakowski
Assistant Examiner—Jiri Smetana
(74) Attorney, Agent, or Firm—Madson & Metcalf

(57) ABSTRACT

A method of in situ reactive gas plasma treatment is disclosed. The method is capable of removing a residue remained in a metal etching chamber after the metal etching process to improve the yield of the wafer and the particle performance of the metal etching chamber. The method includes the steps of (a) vactuating the metal etching chamber after the metal etching process, (b) introducing a reactive gas to the metal etching chamber, and (c) applying an electromagnetic power to the metal etching chamber for producing a plasma derived from the reactive gas to remove the residue inside the metal etching chamber and/or on the wafer.

18 Claims, 1 Drawing Sheet

METHOD OF IN SITU REACTIVE GAS PLASMA TREATMENT

FIELD OF THE INVENTION

The present invention relates to a method of in situ reactive gas plasma treatment, and more particularly to a method for removing a residue remained inside a metal etching chamber and/or on a wafer after completing a metal etching process.

BACKGROUND OF THE INVENTION

In the process for manufacturing an integrated circuit, a plasma etching process is often used to remove the metal, such as aluminum, remained on the surface of a wafer during the metallization process of forming connecting lines. An etching gas is introduced to a metal etching chamber, followed by applying an electromagnetic power to the metal etching chamber for producing plasma derived from the etching gas to react with a portion of aluminum metal uncovered by the photoresist. The formed products are then removed out of the metal etching chamber by vacuum pumps.

Immediately after finishing the metal etching process, there are some residues remained in the metal etching chamber, that is, byproducts of the reaction between the plasma and the metal part uncovered by the photoresist can not be immediately removed out of the metal etching chamber by vacuum pumps. The residues remained on the wafer and/or in the metal etching chamber are white powders containing metal, photoresist, and components of the plasma. Particularly, the grain or powder with a large particle size can be observed by a microscope or even naked eyes. This kind of residue can not be removed after the plasma etching process even though all vacuum pumps are opened. Thus, it is necessary to interrupt the metal etching process and open the metal etching chamber to manually clean and remove the residues at a certain period of time when the amount and the particle size of the residues exceed a certain tolerance. It will decrease the production efficiency because of interrupting the metal etching process too often. Furthermore, the residues with large particle size remained on a wafer will influence the quality of the wafer.

The plasma etching method has been widely used in manufacturing process of integrated circuits and chemical industry. U.S. Pat. No. 4,816,113 discloses a method of using oxygen or a compound thereof as a gas source of chemical vapor deposition (CVD) and removing undesired residues from the reaction chamber by plasma etching after deposition of a carbon film on a substrate. However, it is not suitable for removing the residues produced after the metal etching procedure. Furthermore, before introducing oxygen and/or a compound thereof into a reaction chamber, the wafer with a coated film has to be removed from the reaction chamber, but it can not contribute anything to the particle performance of the metal etching chamber.

In addition, U.S. Pat. No. 4,992,137 discloses another method to prevent the formation of etching residues at low temperature, wherein the wafer is kept at low temperature, and the state of plasma in the reaction chamber is maintained to prevent the byproduct of reaction from being deposited on the wafer, and then an inert gas is introduced to eliminate the byproduct in a form of plasma. However, this method can not be applied to remove the residues formed in the metal etching process.

Therefore, it is tried by the applicant to deal with the situation encountered by the prior art.

SUMMARY OF THE INVENTION

The object of the present invention is to provide a novel method for removing the residue remained inside a metal etching chamber and/or on a wafer after completing a metal etching process.

It is another object of the present invention to provide a method of in situ reactive gas plasma treatment to improve the particle performance of a metal etching chamber.

According to the present invention, the method includes the steps of (a) vacuating the metal etching chamber after the metal etching process, (b) introducing a reactive gas to the metal etching chamber, (c) applying an electromagnetic power to the metal etching chamber for producing a plasma derived from the reactive gas to remove the residue inside the metal etching chamber and/or on the wafer.

In accordance with one aspect of the present invention, the metal etching process is a plasma etching process for forming a metal connecting line on the wafer.

In accordance with another aspect of the present invention, the residue is a white powder including metal, photoresist, and components of an etching gas.

Preferably, the metal is an aluminum alloy.

Preferably, the etching gas includes $BCl_3$, $Cl_2$, and $N_2$ or Ar.

Preferably, the reactive gas is $BCl_3$.

Preferably, the flow rate of the reactive gas is about 100 sccm.

Preferably, the method is executed before removing the wafer out of the metal etching chamber.

Preferably, the electromagnetic power is a radio frequency power (r.f. power).

Preferably, the plasma reacts with the residue for 10 seconds.

In accordance with another aspect of the present invention, after the step of (c), the method further includes a step of (d) vacuating the metal etching chamber.

Another object of the present invention is to provide a method for removing a residue remaining in a plasma etching chamber and on a wafer after a plasma etching process. The method includes the steps of (a) introducing a reactive gas to the plasma etching chamber, and (b) applying an electromagnetic power to the plasma etching chamber for producing a plasma derived from the reactive gas to remove the residue inside the plasma etching chamber and on the wafer.

In accordance with one aspect of the present invention, before the step (a), the method further includes a step of vacuating the plasma etching chamber after completing the plasma etching process.

In accordance with another aspect of the present invention, the plasma reacts with the residue to form a gaseous mixture.

In accordance with another aspect of the present invention, the gaseous mixture is removed by vacuating the plasma etching chamber.

Preferably, the plasma etching process is a metal etching process for forming a metal connecting line on the wafer.

The present invention may best be understood through the following description with reference to the accompanying drawings, in which:

DETAILED DESCRIPTION OF THE PREFERRED EMBODIMENTS

Figure 1:
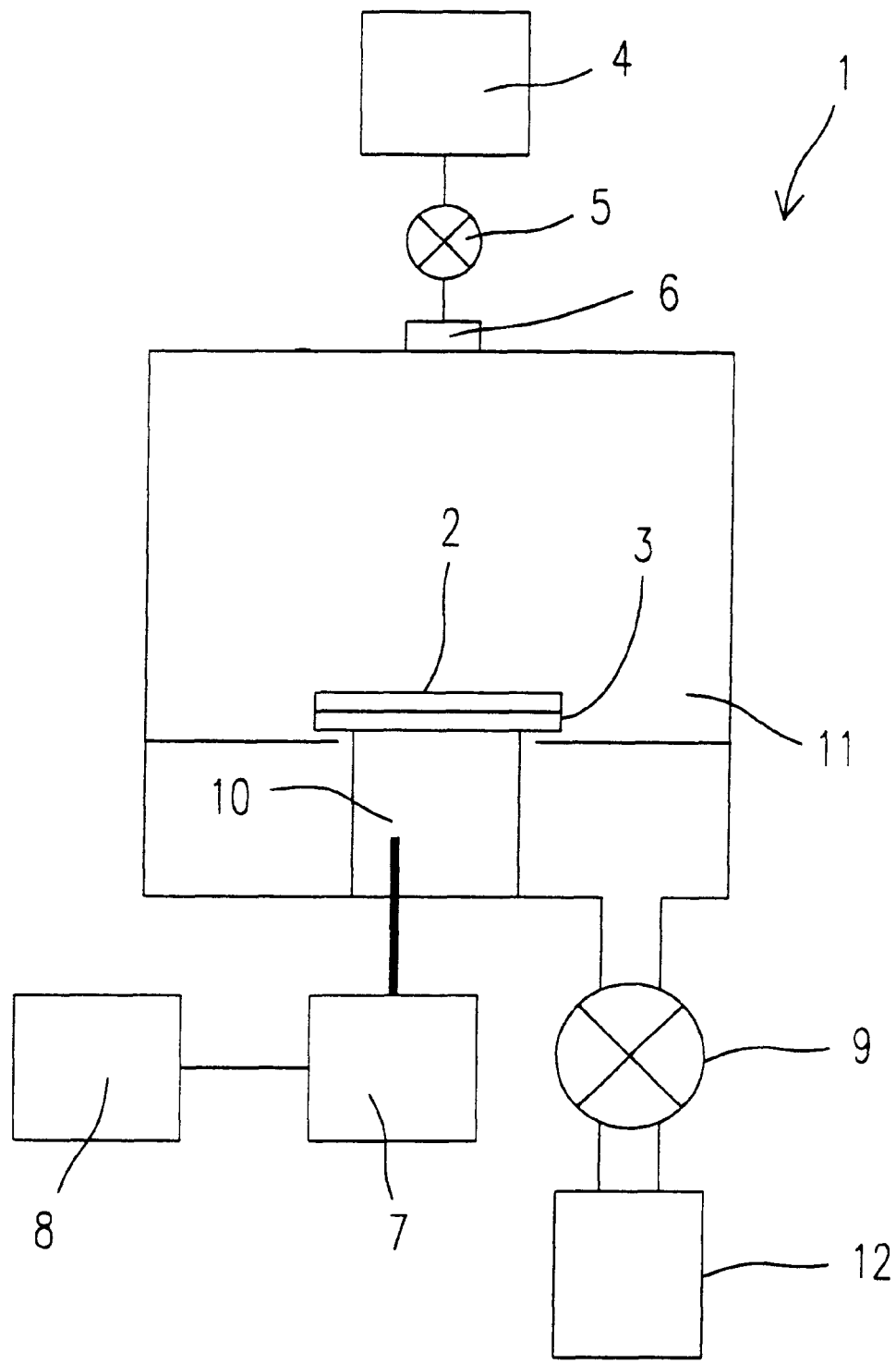
FIG. 1 is a schematic diagram illustrating a metal etching chamber of the present invention.

The present invention will now be described more specifically with reference to the following embodiments. It is to be noted that the following descriptions of preferred embodiments of this invention are presented herein for purpose of illustration and description only, it is not intended to be exhaustive or to be limited to the precise form disclosed.

Please refer to FIG. 1, which shows the schematic diagram of a metal etching chamber of the present invention. The reaction chamber 11 of the metal etching chamber 1 includes a susceptor 3 for disposing a wafer 2 thereon. An etching gas provided from a gas source 4 is introduced into the reaction chamber 11 through control valve 5 and the gas inlet 6. A radio frequency (r.f.) generator 8 is combined with a matching circuit 7 for providing a radio frequency power (r.f power) between the cathode plate 10 and the chamber wall.

A set of vacuum pumps 12 is disposed in the metal etching chamber 1 and connected to the reaction chamber 11 through a control valve 9. The vacuum pumps 12 can be an assembly of rotary pump and turbo molecular pump or the like with the capability of maintaining the reaction chamber 11 at a vacuum condition below 1 mtorr. Certainly, the vacuum pumps can also be anyone which is well known to the skilled in the art and thus are not shown in FIG. 1 in detail.

The method of in situ reactive gas plasma treatment according to the present invention will be described in detail as follows. First of all, in a metal etching process, an etching gas is introduced to the reaction chamber 11. The etching gas is a gas mixture of $BCl_3$, $Cl_2$, and $N_2$ or Ar. A radio frequency electromagnetic power is applied to the reaction chamber 11 for producing a plasma derived from the etching gas to react with the metal part uncovered by photoresist. Finally, the vacuum pumps 12 are used to remove gaseous products. The residue which can not be removed by the vacuum pumps 12 will be deposited on the surface of wafer 2 and the parts around the electrode plate of the reaction chamber 11.

In order to eliminate the residue, the present invention develops a method of in situ reactive gas plasma treatment by utilizing the chemical and ion bombardment to dissociate the previously generated residues and remove them from the reaction chamber 11 by vacuum pumps 12.

When the reaction chamber 11 is maintained at a low pressure (below 1mtorr), a reactive gas is introducing to the reaction chamber 11 from the gas introducing system 4 at a flow rate of about 100 sccm in a short period of about 10 seconds. Perferably, the reactive gas is $BCl_3$. At the same time, a ref power of about 250 W is applied to the reaction chamber 11 by the combination of the r.f, generator 8 and the matching circuit 7 to provide plasma including ions, electrons, and free radicals. The residues react with the plasma to generate gaseous mixtures which can be removed from the reaction chamber 11 by the vacuum pumps 12.

Thus, the method of in situ reactive gas plasma treatment according to the present invention can prevent the residues, particles or powders, from remaining on a wafer so as to increase the yield rate of the wafer and improve the particle performance of the metal etching chamber. Since the reaction time of the plasma and the residue is so short, it will not damage the metal pattern defined by the prior etching reaction process.

Since the reaction time of the plasma and the residue is so short that it will not damage the metal pattern defined by the prior etching reaction process.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar strictures.

What is claimed is:

1. A method for removing a residue remaining in a metal etching chamber and on a wafer after completing a metal etching process upon said wafer, comprising:

(a) evacuating the etching gas from said metal etching chamber after said metal etching process;

(b) introducing a reactive gas consisting essentially of $BCl_3$ gas to said metal etching chamber; and (c) applying an electromagnetic power to said metal etching chamber for producing a plasma derived from said reactive gas to remove said residue inside said metal etching chamber and on said wafer.

2. The method according to claim 1 wherein said metal etching process is a plasma etching process for forming a metal connecting line on said wafer.

3. The method according to claim 1 wherein said residue is a white powder including metal, photoresist, and components of the etching gas.

4. The method according to claim 3 wherein said metal is an aluminum alloy.

5. The method according to claim 3 wherein said etching gas includes $BCl_3$, $Cl_2$, and $N_2$.

6. The method according to claim 3 wherein said etching gas includes $BCl_3$, $Cl_2$, and Ar.

7. The method according to claim 1 wherein a flow rate of said reactive gas is about 100 sccm.

8. The method according to claim 1 wherein said method is executed before removing said wafer out of said metal etching chamber.

9. The method according to claim 1 wherein said electromagnetic power is a radio frequency power (r.f. power).

10. The method according to claim 1 wherein said plasma reacts with said residue for 10 seconds.

11. The method according to claim 1 wherein after said step (c), said method further includes a step of (d) evacuating said metal etching chamber.

12. A method of removing a residue remained in a plasma etching chamber and on a wafer after a plasma etching process, comprising:

(a) introducing a reactive gas consisting essentially of $BCl_3$ gas to said plasma etching chamber; and (b) applying an electromagnetic power to said plasma etching chamber for producing a plasma derived from said reactive gas to remove said residue inside said plasma etching chamber and on said wafer.

13. The method according to claim 12 wherein before said step (a), said method further includes a step of evacuating the etching gas from said plasma etching chamber.

14. The method according to claim 12 wherein said plasma reacts with said residue to form a gaseous mixture.

15. The method according to claim 14 wherein said gaseous mixture is removed by evacuating said plasma etching chamber.

16. The method according to claim 14 wherein said plasma reacts with said residue for 10 seconds.

17. The method according to claim 12 wherein a flow rate of said reactive gas is about 100 sccm.

18. The method according to claim 12 wherein said plasma etching process is a metal etching process for forming a metal connecting line on said wafer.

\* \* \* \* \*

UNITED STATES PATENT AND TRADEMARK OFFICE
CERTIFICATE OF CORRECTION

PATENT NO.     : 6,374,833 B1
DATED          : April 23, 2002
INVENTOR(S)    : Yuan et al.

It is certified that error appears in the above-identified patent and that said Letters Patent is hereby corrected as shown below:

<u>Column 4,</u>
Line 5, please delete "strictures" and replace it with -- structures --.
Line 52, after the word "chamber" please add -- after completing said plasma etching process. --

Signed and Sealed this

Tenth Day of February, 2004

JON W. DUDAS
*Acting Director of the United States Patent and Trademark Office*